(12) United States Patent
Takigawa et al.

(10) Patent No.: US 7,439,552 B2
(45) Date of Patent: Oct. 21, 2008

(54) SEMICONDUCTOR LIGHT-EMITTING DEVICE AND METHOD FOR FABRICATING THE SAME

(75) Inventors: Shinichi Takigawa, Osaka (JP); Daisuke Ueda, Osaka (JP); Susumu Koike, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 104 days.

(21) Appl. No.: 11/492,130

(22) Filed: Jul. 25, 2006

(65) Prior Publication Data

US 2007/0023763 A1 Feb. 1, 2007

(30) Foreign Application Priority Data

Jul. 27, 2005 (JP) .............................. 2005-217874

(51) Int. Cl.
*H01L 33/00* (2006.01)

(52) U.S. Cl. ............................. 257/98; 257/81; 257/99; 257/E33.074; 257/E33.067

(58) Field of Classification Search .................. 257/98, 257/E33.074
See application file for complete search history.

(56) References Cited

U.S. PATENT DOCUMENTS

| 2001/0033135 | A1* | 10/2001 | Duggal et al. | ............... 313/506 |
| 2003/0227249 | A1* | 12/2003 | Mueller et al. | ............... 313/491 |
| 2005/0194605 | A1* | 9/2005 | Shelton et al. | ................ 257/99 |

FOREIGN PATENT DOCUMENTS

| JP | 59-050401 | 3/1984 |
| JP | 08-110401 | 4/1996 |
| JP | 2005-005679 | 1/2005 |

* cited by examiner

*Primary Examiner*—Tu-Tu V Ho
(74) *Attorney, Agent, or Firm*—McDermott Will & Emery LLP

(57) ABSTRACT

A semiconductor light-emitting device includes a light-emitting layer and a light extraction layer formed on the light-emitting layer and made of a resin material containing particles. The maximum size of each of the particles contained in the light extraction layer is smaller than the wavelength of emitted light penetrating through the light extraction layer.

4 Claims, 11 Drawing Sheets

SEMICONDUCTOR LIGHT-EMITTING DEVICE AND METHOD FOR FABRICATING THE SAME

CROSS-REFERENCE TO RELATED APPLICATIONS

The disclosure of Japanese Patent Application No. 2005-217874 filed on Jul. 27, 2005 including specification, drawings and claims is incorporated herein by reference in its entirety.

BACKGROUND OF THE INVENTION (1) Field of the Invention

The present invention relates to semiconductor light-emitting devices, such as light-emitting diodes or semiconductor laser diodes.

(2) Description of Related Art

In recent years, use of a Group III-V nitride semiconductor material has come to provide emitted light in the blue-to-ultraviolet region of the spectrum. Thus, light-emitting diodes capable of emitting three primary colors, red (R), green (G) and blue (B), respectively, have all been available. Hence, all the light rays in the visible region of the spectrum have been able to be produced by light-emitting diodes. This has led to expansion of the market for light-emitting diodes serving as light sources for display applications and light sources for illumination.

A blue light-emitting diode using a Group III-V nitride semiconductor material according to a first known example will be described hereinafter with reference to FIG. 15. As illustrated in FIG. 15, a blue light-emitting diode is configured such that an n-type GaN layer 102, an active layer 103 of undoped InGaN and a p-type GaN layer 104 are sequentially formed on the principal surface of a substrate 101 of sapphire by epitaxial growth. Electrons are injected from the n-type GaN layer 102 into the active layer 103, and holes are injected from the p-type GaN layer 104 thereinto. The injected electrons and holes are recombined in the active layer 103, thereby producing emitted light rays 110 and 112.

Among the emitted light rays produced by the recombination of electrons and holes in the active layer 103, the emitted light ray 110 forming a smaller angle relative to the normal to a light-outputting surface 105 of the blue light-emitting diode than the critical angle $\theta_1$ is delivered to outside as an outgoing light ray 111. On the other hand, the emitted light ray 112 forming a larger angle relative to the above-mentioned normal than the critical angle $\theta_1$ is totally reflected so as to be confined, as an internal light 113, within the p-type GaN layer 104 and therefore is not allowed to outgo. The critical angle $\theta_1$ herein is determined by the following formula (1).

$$\theta_1 = \sin^{-1}(N_1/N_2) \quad (1)$$

Herein, $N_1$ represents the refractive index of a surrounding of a semiconductor (air) for an emitted light ray, and $N_2$ represents the refractive index of a semiconductor for an emitted light ray.

For example, the refractive index $N_2$ of a GaN-based semiconductor is approximately 2.4, and the refractive index $N_1$ of air is 1. Accordingly, the angle $\theta_1$ is approximately 25° when determined in accordance with the formula (1). The emitted light produced in the active layer 103 is radiated substantially isotropically. When the critical angle $\theta_1$ is small like approximately 25°, this prevents many emitted light rays from being extracted from the diode.

To cope with this, like a blue light-emitting diode according to a second known example illustrated in FIG. 16 (see, for example, Japanese Unexamined Patent Publication No. 2005-5679), the configuration of a blue light-emitting diode has been proposed in which a resin film formed with corrugations of a two-dimensional periodic structure is formed on a semiconductor layer to prevent the light extraction efficiency with which light can be extracted from the blue light-emitting diode from decreasing due to total reflection. More specifically, a film 106 of a polycarbonate resin material is formed on a p-type GaN layer 104. The resin film 106 is formed at its top surface with two-dimensional periodic corrugations 106a.

Diffraction vectors effected by the two-dimensional periodic corrugations 106a allow many of emitted light rays to be incident upon the interface 107 between the p-type GaN layer 104 and the resin film 106 at a smaller angle than the critical angle $\theta_1$. This enhances the light extraction efficiency. In particular, in the use of a semiconductor material of a high etching resistance, e.g., a nitride semiconductor, after the formation of the resin film 106 on the top surface of the semiconductor material, a stamper formed at its pressing surface with corrugations is pressed against the formed resin film 106. In this manner, the two-dimensional periodic corrugations 106a are formed by transferring the corrugations of the stamper to the resin film 106.

Meanwhile, since in general a resin material has a different refractive index from a semiconductor, total reflection takes place also at the interface 107. In this case, the critical angle $\theta_2$ is expressed by the following formula (2).

$$\theta_2 = \sin^{-1}(N_3/N_2) \quad (2)$$

Herein, $N_3$ represents the refractive index of a resin material for an emitted light ray, and $N_2$ represents the refractive index of a semiconductor for an emitted light ray.

The refractive index $N_3$ of a resin material is approximately 1.6, and the refractive index $N_2$ of a GaN-based semiconductor is approximately 2.4. The critical angle $\theta_2$ is approximately 42° when determined in accordance with the formula (2). Even when like the second known example a resin film 106 having a smaller refractive index than the p-type GaN layer 104 is formed on the p-type GaN layer 104, light extraction efficiency is insufficient.

SUMMARY OF THE INVENTION

The present invention is made to solve the above-mentioned conventional problems, and its object is to improve the efficiency with which light is extracted from a semiconductor light-emitting device.

In order to achieve the above-mentioned object, a semiconductor light-emitting device of the present invention is configured to allow a light extraction layer made of a dielectric formed on a semiconductor layer to contain particles having a larger refractive index than the dielectric and a smaller diameter than the wavelength of emitted light.

To be specific, a semiconductor light-emitting device according to a first aspect of the present invention includes: a light-emitting layer; and a light extraction layer formed on the light-emitting layer and containing particles. The maximum size of each said particle is smaller than the wavelength of emitted light penetrating through the light extraction layer.

According to the semiconductor light-emitting device of the first aspect, particles with which the light extraction layer is added have a smaller diameter than the wavelength of emitted light penetrating through the light extraction layer.

This prevents the emitted light from being scattered. The emitted light therefore penetrates through the light extraction layer in the same manner as when the light extraction layer is uniform. This can prevent an incident angle of the emitted light on the light extraction layer from reaching the critical angle, resulting in improved light extraction efficiency.

In the semiconductor light-emitting device of the first aspect, the refractive index of each said particle for the emitted light is preferably larger than that of the light extraction layer for the emitted light.

A semiconductor light-emitting device according to a second aspect of the present invention includes: a semiconductor layered structure obtained by stacking a plurality of semiconductor layers including a light-emitting layer; and a light extraction layer made of a resin material formed on the top surface of at least one part of the semiconductor layered structure. Said resin material contains particles, the refractive index of each said particle for emitted light is larger than that of the resin material for the emitted light, and the size of each said particle is smaller than the wavelength of the emitted light penetrating through the resin material.

According to the semiconductor light-emitting device of the second aspect, the resin material forming the light extraction layer contains particles having a larger refractive index than the resin material. This can increase the effective refractive index of the resin material. Accordingly, $N_3$ in $N_3/N_2$ of the formula (2) is increased, leading to an increase of the critical angle $\theta_2$. As a result, light extraction efficiency is improved. In addition, the contained particles have a smaller diameter than the wavelength of the emitted light penetrating through the resin material. This prevents the emitted light from being scattered. The emitted light therefore penetrates through the resin material in the same manner as when the resin material is uniform.

By the way, Japanese Unexamined Patent Publications Nos. 59-050401 and 8-110401 disclose the following technique: An anti-reflection film made of a resin material formed on the top surface of a lens or a display is allowed to contain fine particles having a larger refractive index than the resin material, resulting in an enhanced effective refractive index of the resin material. However, the following effects brought about by provision of such an anti-reflection film on the light-emitting surface of a light-emitting diode are not disclosed in the above-mentioned publications: The provision of such an anti-reflection film on the light-emitting surface of a light-emitting diode improves the efficiency with which emitted light is extracted from the light-emitting diode (hereinafter, referred to as "light extraction efficiency") and suppresses total reflection of the emitted light.

In the semiconductor light-emitting device of the first or second aspect, the light extraction layer is preferably formed at its top surface with corrugations. Also in the present invention, the difference in refractive index between air and the resin material forming the light extraction layer causes total reflection at the top surface of the light extraction layer. To cope with this, the top surface of the light extraction layer is formed with corrugations. This allows various incident angles of rays of the emitted light on the light extraction layer. As a result, more emitted light rays can be extracted outward.

In this case, the corrugations are preferably of a periodic structure. When the corrugations are thus of a periodic structure, the corrugations provide a vector effect of diffracted light. This prevents incident angles of more rays of the emitted light from reaching the critical angle, resulting in further improved light extraction efficiency.

The light extraction layer is preferably added with the particles such that the density of the particles is gradually decreased in a direction of emission of the emitted light. The refractive index of the light extraction layer (resin material) is thus gradually decreased in the direction of emission of the emitted light. Therefore, the refractive index of part of the resin material located in the vicinity of the interface between the resin material and air becomes close to that of air. This increases the critical angle relative to the normal to the interface between the resin material and air, resulting in more rays of the emitted light extracted outward.

In this case, the light extraction layer preferably includes a first layer and a second layer sequentially formed on the light-emitting layer, and the amount of ones of the particles with which the second layer is added is preferably smaller than that of ones of the particles with which the first layer is added. This also increases the critical angle relative to the normal to the interface between the second layer added with a smaller amount of particles than the first layer and air, resulting in more rays of the emitted light extracted outward.

The semiconductor light-emitting device of the first or second aspect may further include: an electrode for injecting carriers into the light-emitting layer; and a wire connected to the electrode, an end surface of the light extraction layer being apart from the electrode and the wire. With this structure, even when impurities only slightly existing in the resin material exhibit ionic conductivity and therefore the light extraction layer becomes conductive, electrical isolation of the light extraction layer from the electrode and the wire prevents a voltage from being applied to the light extraction layer. Therefore, no leakage current through the light extraction layer is caused. This can prevent reactive current.

In the semiconductor light-emitting device of the first or second aspect, the light extraction layer is preferably formed to cover top and side surfaces of the light-emitting layer.

A method for fabricating a semiconductor light-emitting device according to the present invention includes the steps of: (a) sequentially stacking a first semiconductor layer, a light-emitting layer and a second semiconductor layer on a wafer-level substrate, thereby forming a semiconductor layered structure; (b) forming, on the semiconductor layered structure, a light extraction layer made of a resin material containing particles; (c) selectively removing a portion of the light extraction layer located on a first electrode formation region of the second semiconductor layer, thereby exposing the first electrode formation region; (d) forming a first electrode on the exposed first electrode formation region; (e) selectively removing respective portions of the light extraction layer, the second semiconductor layer and the light-emitting layer located on a second electrode formation region of the first semiconductor layer, thereby exposing the second electrode formation region; (f) forming a second electrode on the exposed second electrode formation region; and (g) dividing, into chips, the wafer-level substrate on which the semiconductor layered structure formed with the light extraction layer, the first electrode and the second electrode is formed, wherein the resin material has a first refractive index that is smaller than a second refractive index of the semiconductor layered structure for emitted light from the light-emitting layer, and the particles are transparent to the emitted light, have a third refractive index that is larger than the first refractive index and have a smaller diameter than the wavelength of the emitted light penetrating through the resin material.

According to the fabrication method for a semiconductor light-emitting device of the present invention, the semiconductor light-emitting device can be provided. In addition, in the step (b), the resin material can be applied onto the wafer-level substrate by spin coating, and in the steps (c) and (e), semiconductor fabrication processes, such as lithography, can be used. This allows the resin material to be formed on the entire surface of the wafer-level substrate at the same time, resulting in high productivity maintained.

In the method of the present invention, the step (b) preferably includes the step of, after the formation of the resin material on the semiconductor layered structure and before curing of the formed resin material, pressing a die with corrugations against the top surface of the resin material and transferring the corrugations to the top surface of the resin material, thereby forming corrugations at the top surface of the light extraction layer. The method of the present invention may necessitate that the period of the corrugations be designed as 1 μm or less. Lithography is suitable for such fine patterning. The use of lithography, however, entails high cost and provides low productivity. To cope with this, corrugations are formed at the top surface of the resin material by pressing the die with the corrugations against the resin material, leading to low cost and high productivity.

Thus, according to the semiconductor light-emitting device of the present invention and the fabrication method for the same, the light extraction efficiency of the semiconductor light-emitting device can be improved with simplicity and reliability.

BRIEF DESCRIPTION OF THE DRAWINGS

FIGS. 1A and 1B illustrate a semiconductor light-emitting device according to a first embodiment of the present invention, in which FIG. 1A is a perspective view of the semiconductor light-emitting device and FIG. 1B is a cross-sectional view taken along the line Ib-Ib in FIG. 1A.

FIGS. 4A and 4B illustrate a semiconductor light-emitting device according to a variant of the first embodiment of the present invention, in which FIG. 4A is a perspective view of the semiconductor light-emitting device and FIG. 4B is a cross-sectional view taken along the line IVb-IVb in FIG. 4A.

FIGS. 6A and 6B illustrate a semiconductor light-emitting device according to a third embodiment of the present invention, in which FIG. 6A is a perspective view of the semiconductor light-emitting device and FIG. 6B is a cross-sectional view taken along the line VIb-VIb in FIG. 6A.

FIGS. 10A and 10B illustrate a semiconductor light-emitting device according to a fifth embodiment of the present invention, in which FIG. 10A is a cross-sectional view of the semiconductor light-emitting device and FIG. 10B is a partially enlarged cross-sectional view of a light extraction layer of the semiconductor light-emitting device and its vicinity.

DETAILED DESCRIPTION OF THE INVENTION

EMBODIMENT 1

A first embodiment of the present invention will be described with reference to the drawings.

Figure 1A:
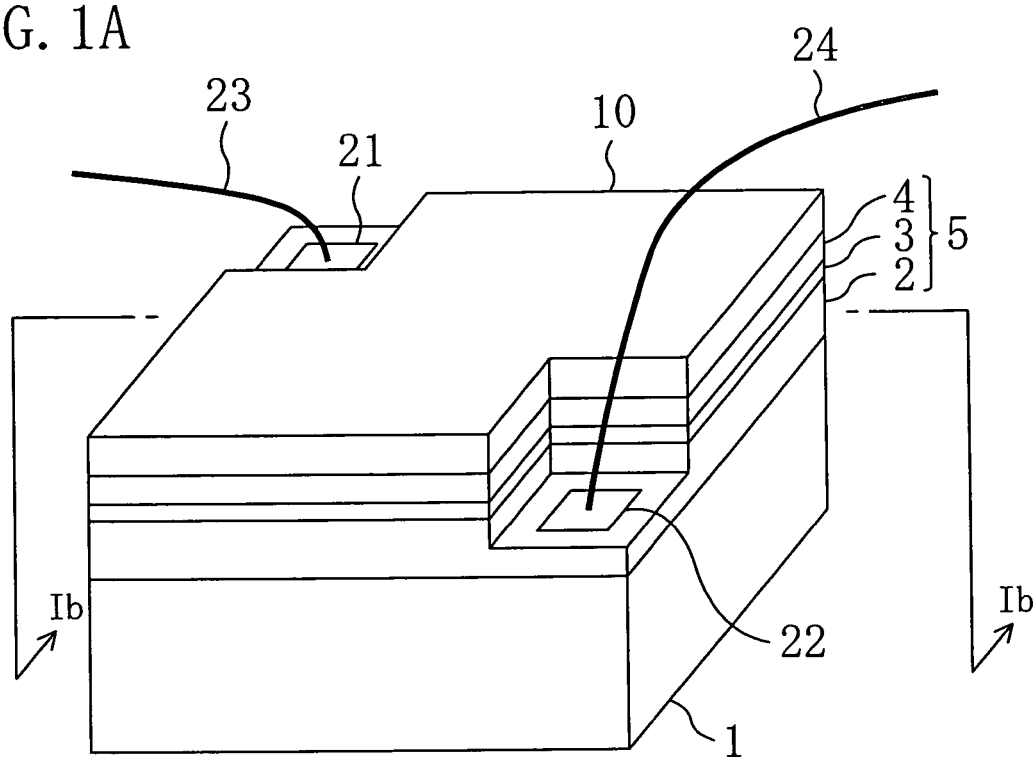
Figure 1B:
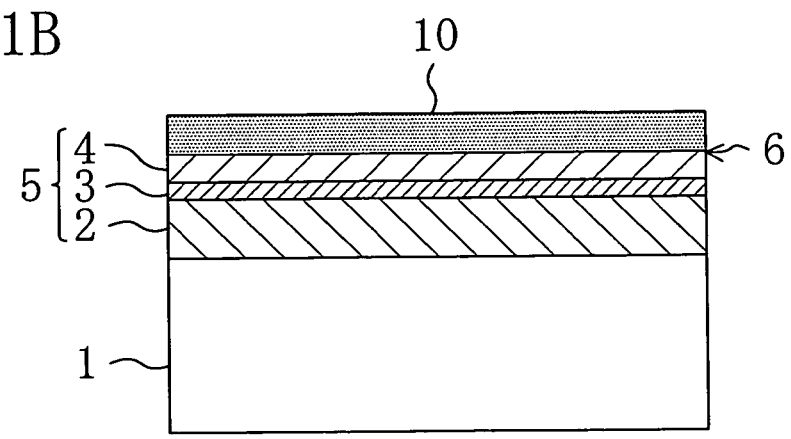

FIGS. 1A and 1B illustrate a semiconductor light-emitting device according to a first embodiment of the present invention. FIG. 1A is a perspective view of the semiconductor light-emitting device, and FIG. 1B is a cross-sectional view taken along the line Ib-Ib in FIG. 1A.

As illustrated in FIGS. 1A and 1B, a semiconductor light-emitting device according to the first embodiment of the present invention represents a light-emitting diode and includes a semiconductor layered structure 5 composed of a 1-μm-thick first semiconductor layer 2 of n-type gallium nitride (GaN), a 0.05-μm-thick active layer 3 of undoped indium gallium nitride (InGaN) and a 0.5-μm-thick second semiconductor layer 4 of p-type GaN. The first semiconductor layer 2, the active layer 3 and the second semiconductor layer 4 are sequentially formed on the principal surface of a substrate 1 of, for example, 500-μm-thick sapphire (monocrystalline $Al_2O_3$), by epitaxial growth.

The In composition of the InGaN forming the active layer 3 is adjusted so that the active layer 3 produces blue light with a wavelength of approximately 460 nm.

A light extraction layer 10 made of a 0.2-μm-thick silicone resin material and added with fine particles having a larger refractive index than the silicone resin material is formed on the semiconductor layered structure 5, i.e., on the second semiconductor layer 4.

As illustrated in FIG. 1A, a p-side electrode 21 composed of a layered film of nickel (Ni) and gold (Au) is formed on a part of the second semiconductor layer 4 exposed from the light extraction layer 10 so as to be connected with a p-side wire 23 of gold. An n-side electrode 22 composed of a layered film of titanium (Ti) and aluminum (Al) is formed on a part of the first semiconductor layer 2 exposed from the light extraction layer 10, the second semiconductor layer 4 and the active layer 3 so as to be connected with an n-side wire 24 of gold. The p-side electrode 21, the n-side electrode 22, the p-side wire 23, and the n-side wire 24 are all configured so as to be prevented from coming into contact with the end surfaces of the light extraction layer 10.

For blue light, the refractive index of a silicone resin material forming the light extraction layer 10 is approximately 1.6. The silicone resin material is added with fine particles that have an average diameter of 50 nm, are transparent to blue light and are made of titanium dioxide (TiO$_2$) having a refractive index of 2.4. The fine particles made of titanium dioxide have the following characteristics.

First, the fine particles have an average diameter of 50 nm which is much smaller than the wavelength of blue light in the silicone resin material, i.e., 300 nm. This prevents emitted light from being scattered. Second, fine particles having a diameter of approximately 50 nm sufficiently enter into the spaces between polymer molecules forming silicone resin. This can significantly enhance the content of titanium dioxide in the silicone resin material.

In the first embodiment, a silicone resin material is allowed to contain titanium dioxide at a volume proportion of approximately 70%. Thus, the light extraction layer 10 containing titanium dioxide has an effective refractive index of approximately 2.16. In view of the above, the critical angle relative to the normal to the light extraction interface 6 representing the interface between the second semiconductor layer 4 having a refractive index of 2.4 and the light extraction layer 10 is approximately 64° when determined in accordance with the previously-mentioned formula (2).

In view of the above, according to the first embodiment, the critical angle relative to the normal to the interface between the second semiconductor layer 4 and the light extraction layer 10 can be made larger than the critical angle relative to the normal to the surface of a resin film that does not contain fine particles, i.e., 42°. Therefore, the light extraction efficiency is increased to approximately 1.2 times that in the use of the resin film that does not contain fine particles.

A fabrication method for a semiconductor light-emitting device having the above-mentioned structure will be described hereinafter with reference to the drawings.

FIGS. 2A through 2F and FIGS. 3A through 3C are cross-sectional views illustrating process steps in a fabrication method for a semiconductor light-emitting device according to a first embodiment of the present invention step by step. In these figures, only one diode is illustrated. Actually, a 5.1-cm (2-inch)-diameter wafer is used as a substrate for epitaxial growth. In this case, approximately 2,000 diodes are simultaneously processed at a single wafer.

Figure 2A:
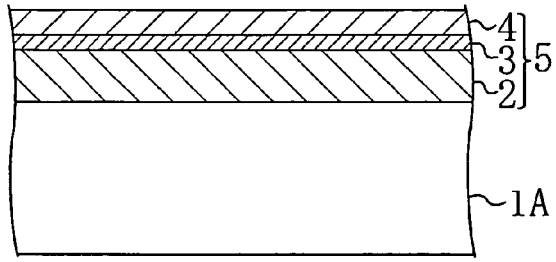
FIGS. 2A through 2F are cross-sectional views illustrating process steps in a fabrication method for a semiconductor light-emitting device according to the first embodiment of the present invention step by step.

First, as illustrated in FIG. 2A, a first semiconductor layer 2 of n-type GaN, an active layer 3 of undoped InGaN and a second semiconductor layer 4 of p-type GaN are sequentially grown on the principal surface of a wafer 1A of sapphire by metal-organic vapor phase epitaxy (MOVPE). These layers form a semiconductor layered structure 5. A buffer layer of GaN or AlGaN may be formed between the wafer 1A and the first semiconductor layer 2 as appropriate.

Figure 2B:
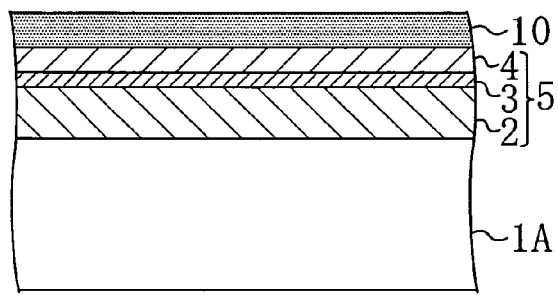

Next, as illustrated in FIG. 2B, a silicone resin material containing fine particles of titanium dioxide at a volume proportion of 70% is applied onto the semiconductor layered structure 5 by spin coating. Thereafter, the silicone resin material is heated using an oven and thus cured, thereby forming a light extraction layer 10.

Figure 2C:
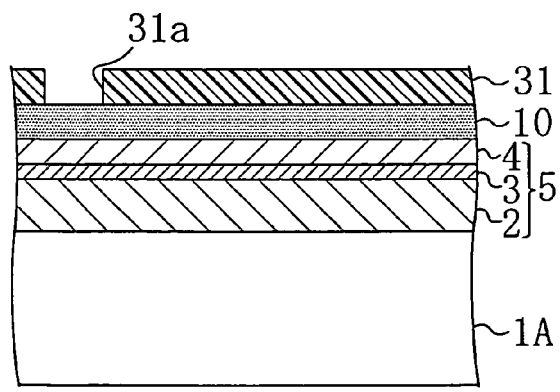

Next, as illustrated in FIG. 2C, a first resist pattern 31 is formed on the light extraction layer 10 by lithography such that its opening 31a exposes a portion of the light extraction layer located on a later-described region 4a of the second semiconductor layer 4 on which a p-side electrode is to be formed (hereinafter, referred to as "p-side electrode formation region 4a").

Figure 2D:
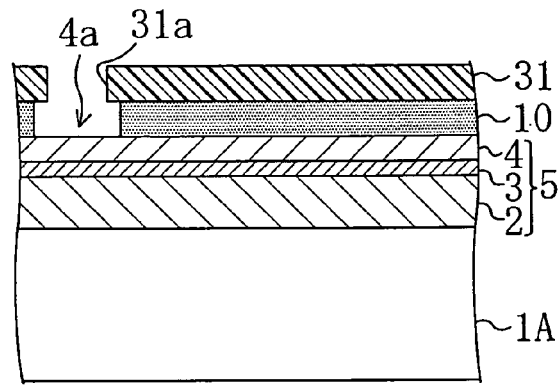

Next, as illustrated in FIG. 2D, the light extraction layer 10 is subjected to wet etching using the first resist pattern 31 as a mask and a mixed solution of sulfuric acid (H$_2$SO$_4$), a hydrogen peroxide (H$_2$O$_2$) solution and water (H$_2$O) as an etchant. In this way, the portion of the light extraction layer 10 located on the p-side electrode formation region 4a is removed to expose the p-side electrode formation region 4a. Since the wet etching is isotropic, the p-side electrode formation region 4a becomes wider than the opening 31a of the first resist pattern 31.

Figure 2E:
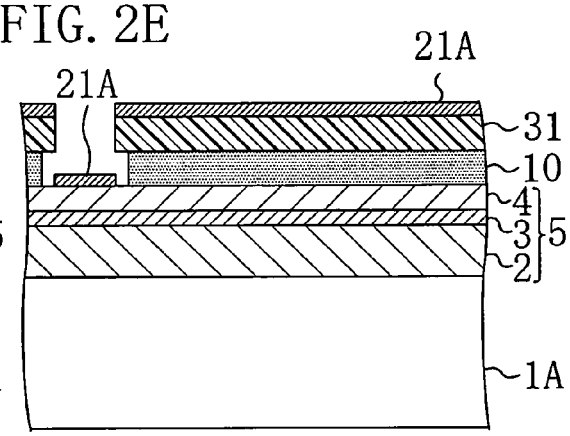

Next, as illustrated in FIG. 2E, an electrode formation film 21A that will partially become an electrode is deposited on the first resist pattern 31 and the p-side electrode formation region 4a, for example, by sputtering or vacuum evaporation, to have a layered structure of Ni and Au. Since the opening 31a of the first resist pattern 31 has a smaller width than the p-side electrode formation region 4a as previously described, this prevents the ends of a portion of the electrode formation film 21A located on the p-side electrode formation region 4a from coming into contact with the end surfaces of the light extraction layer 10.

Figure 2F:
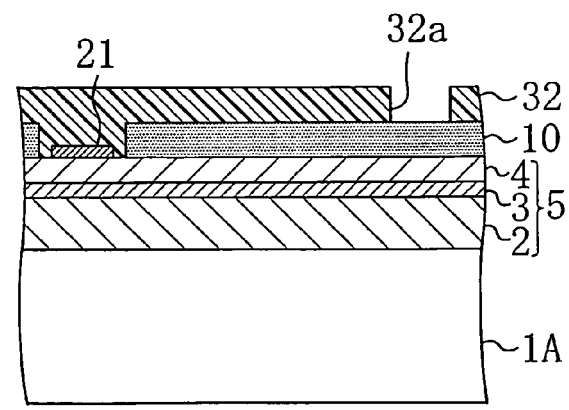

Next, as illustrated in FIG. 2F, a so-called lift-off method for removing the first resist pattern 31 using an organic solution allows selective removal of not only the first resist pattern 31 but also a portion of the electrode formation film 21A located on the first resist pattern 31. In this way, a p-side electrode 21 is formed on the p-side electrode formation region 4a of the second semiconductor layer 4. Subsequently, a second resist pattern 32 is formed on the light extraction layer 10 by lithography again such that its opening 32a exposes a portion of the light extraction layer 10 located on a later-described region 2a of the first semiconductor layer 2 in which an n-side electrode is to be formed.

Figure 3A:
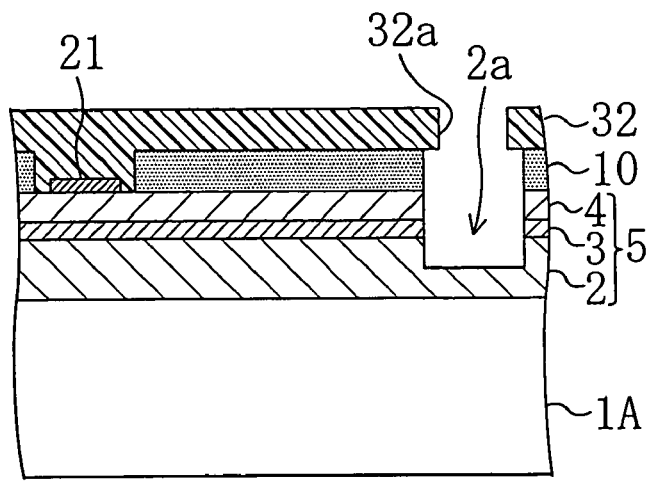
FIGS. 3A through 3C are cross-sectional views illustrating process steps in the fabrication method for a semiconductor light-emitting device according to the first embodiment of the present invention step by step.

Next, as illustrated in FIG. 3A, first, the light extraction layer 10 is subjected to wet etching using the second resist pattern 32 as a mask and a mixed solution of H$_2$SO$_4$, H$_2$O$_2$ and H$_2$O as an etchant, thereby removing a portion of the light extraction layer 10 located on the n-side electrode formation region 2a. Subsequently, the second semiconductor layer 4, the active layer 3 and the upper portion of the first semiconductor layer 2 are subjected to dry etching using the second resist pattern 32 as a mask, more particularly, reactive ion etching using a gas having chlorine (Cl$_2$) as the main ingredient. In the above-mentioned case, isotropic wet etching and side etch resulting from the reactive ion etching allow the n-side electrode formation region 2a to have a larger width than the opening 32a of the second resist pattern 32.

Figure 3B:
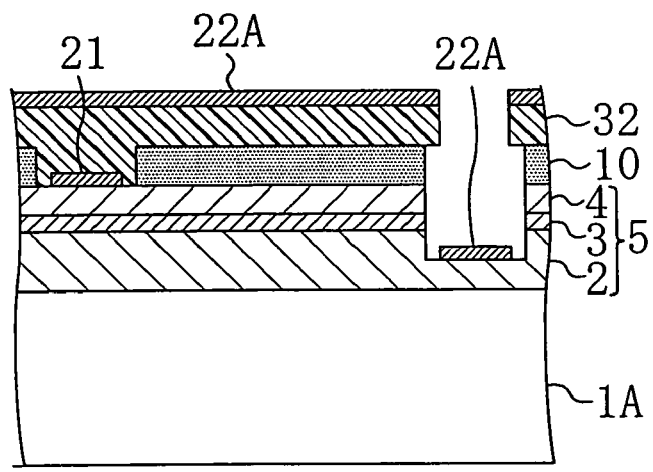

Next, as illustrated in FIG. 3B, an electrode formation film 22A is deposited on the second resist pattern 32 and the n-side electrode formation region 2a, for example, by sputtering or vacuum evaporation, to have a layered structure of Ti and Al. Since the opening 32a of the second resist pattern 32 has a smaller width than the n-side electrode formation region 2a as previously described, this prevents the ends of a portion of the electrode formation film 22A located on the n-side electrode formation region 2a from coming into contact with the end surfaces of the light extraction layer 10.

Figure 3C:
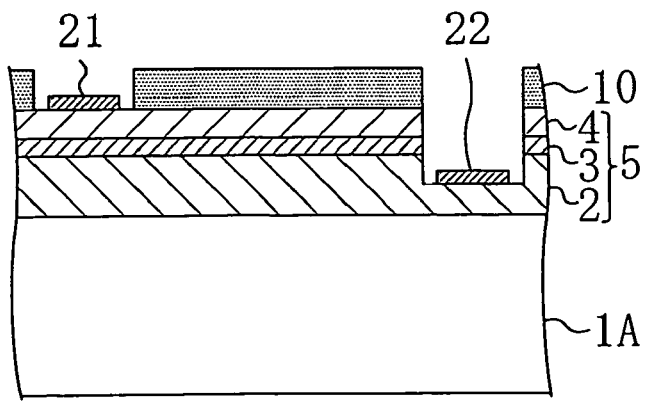

Next, as illustrated in FIG. 3C, when the second resist pattern 32 is removed using an organic solution, a portion of the electrode formation film 22A located on the second resist pattern 32 are also selectively removed. In this way, an n-side electrode 22 is formed on the n-side electrode formation region 2a of the first semiconductor layer 2.

Although in the first embodiment a p-side electrode 21 is formed earlier than an n-side electrode 22, the n-side electrode 22 may be formed earlier than the p-side electrode 21. However, when the n-side electrode 22 is formed earlier than the p-side electrode 21, a first resist pattern 31 for the formation of the p-side electrode 21 will extend also onto the n-side electrode 22. This may cause that the first resist pattern 31 is partly left even after removal of the first resist pattern 31. Therefore, the p-side electrode 21 is preferably formed earlier than the n-side electrode 22.

Thereafter, although not illustrated, the wafer 1A is separated into diodes by a dicing device such that the diodes take the form of a chip having a two-dimensional size of 300 μm×300 μm, and then these diodes are packaged. Thereafter, a p-side wire 23 and an n-side wire 24 are provided on the p-side electrode 21 and the n-side electrode 22, respectively. Thus, the semiconductor light-emitting device illustrated in FIG. 1A is obtained.

VARIANT OF EMBODIMENT 1

Figure 4A:
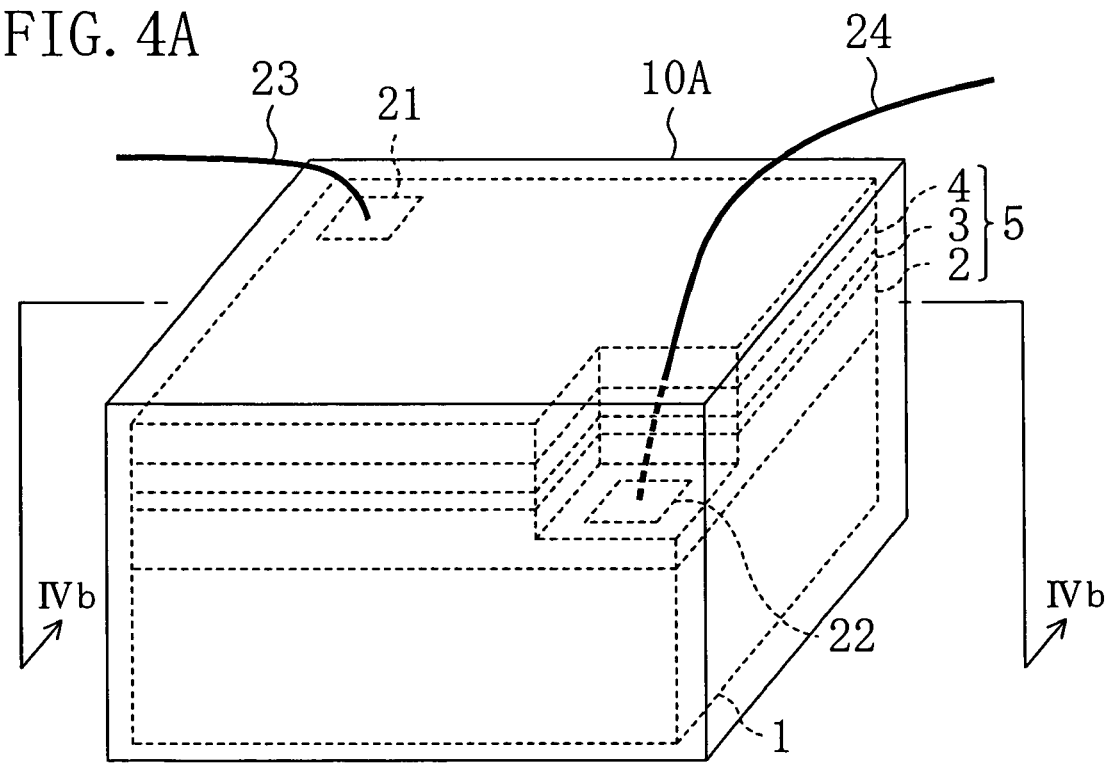
Figure 4B:
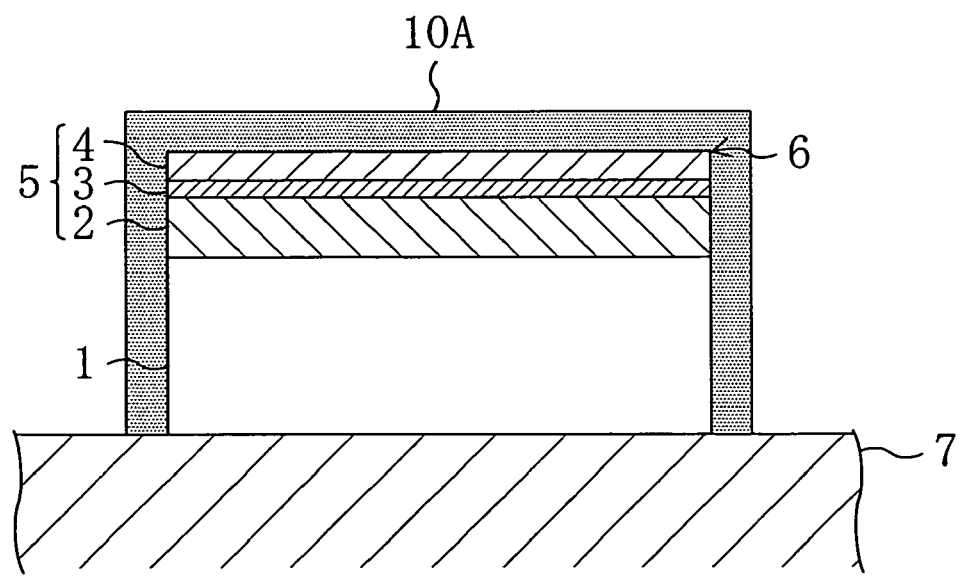

A semiconductor light-emitting device according to a variant of the first embodiment of the present invention will be described hereinafter with reference to FIGS. 4A and 4B. In FIGS. 4A and 4B, the same components as illustrated in FIGS. 1A and 1B are denoted by the same reference numerals, and description thereof will be omitted.

As illustrated in FIGS. 4A and 4B, the semiconductor light-emitting device according to this variant is configured such that a light extraction layer 10A of a silicone resin material containing fine particles made of titanium dioxide at a volume proportion of 70% is formed to cover the top and side surfaces of the semiconductor light-emitting device, i.e., the entire surface thereof. In other words, as illustrated in the cross-sectional view of FIG. 4B, the light extraction layer 10A is formed to cover all the exposed surfaces of the semiconductor light-emitting device except for the bottom surface thereof coming into contact with a radiator plate 7.

Light rays are emitted from an active layer 3 in various directions, for example, also to the sides of a semiconductor layered structure 5 and to below the semiconductor layered structure 5 (toward a substrate 1). Therefore, it is desirable that the light rays emitted from the active layer 3 do not cause total reflection even at the side surfaces of the semiconductor layered structure 5.

In this variant, a light extraction layer 10A of a silicone resin material containing fine particles is formed to cover also the side surfaces of the semiconductor layered structure 5 and the side surfaces of the substrate 1. This can further enhance the efficiency with which emitted light is extracted from the semiconductor light-emitting device.

The light extraction efficiency of the semiconductor light-emitting device according to this variant can be increased to approximately twice that of a semiconductor light-emitting device formed with no light extraction layer 10A.

A fabrication method for a semiconductor light-emitting device according to this variant will be briefly described as follows. First, before provision of a light extraction layer 10A, a p-side electrode 21 is formed on a wafer-level semiconductor layered structure 5, and an n-side electrode 22 is formed on a region of a first semiconductor layer 2 in which the n-side electrode 22 is to be formed. Under the above-mentioned circumstance, a wafer is divided into chips. Thereafter, as illustrated in FIG. 4B, each of the resultant semiconductor light-emitting devices is placed on a radiator plate 7. Subsequently, a p-side wire 23 and an n-side wire 24 are formed on the p-side electrode 21 and the n-side electrode 22, respectively. Thereafter, an uncured silicone resin material containing fine particles is dropped onto a chip-level semiconductor light-emitting device, thereby providing the semiconductor light-emitting device illustrated in FIG. 4B.

EMBODIMENT 2

Figure 5:
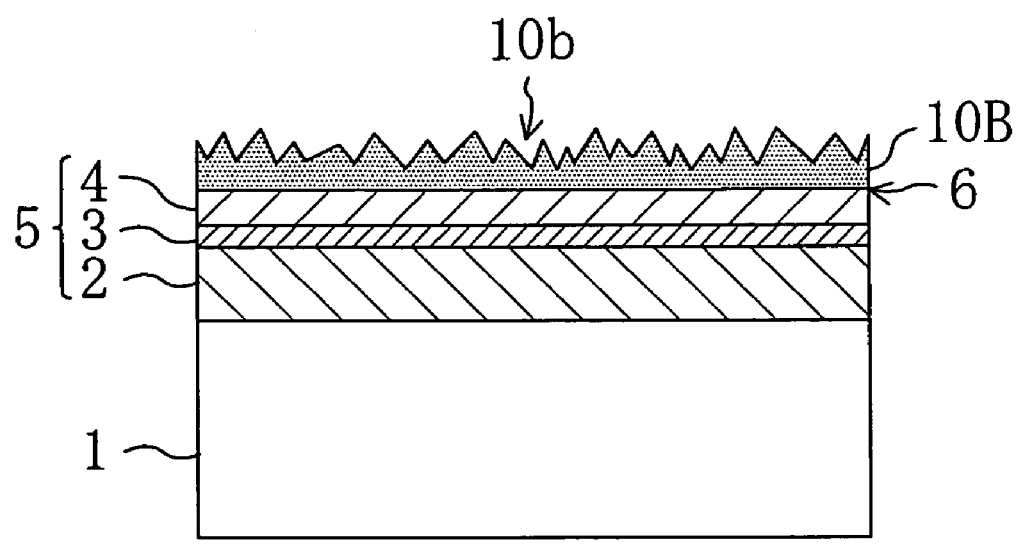
FIG. 5 is a cross-sectional view illustrating a semiconductor light-emitting device according to a second embodiment of the present invention.

A semiconductor light-emitting device according to a second embodiment of the present invention will be described hereinafter with reference to FIG. 5. In FIG. 5, the same components as illustrated in FIG. 1B are denoted by the same reference numerals, and description thereof will be omitted.

As illustrated in FIG. 5, the semiconductor light-emitting device according to the second embodiment is configured such that a light extraction layer 10B made of a silicone resin material containing fine particles at a volume proportion of 70% is formed at its top surface with corrugations 10b. The corrugations 10b have no periodic structure.

For the light extraction layer 10B formed at its top surface with corrugations 10b, even emitted light rays that penetrate through the light extraction layer 10B and are incident upon the top surface of the light extraction layer 10B from the same direction have different angles of incidence according to locations of the light rays incident upon the light extraction layer 10B. More particularly, when the light extraction layer 10B is formed at its top surface with corrugations 10b, even emitted light rays incident upon the top surface of the light extraction layer 10B from such directions that if the top surface of the light extraction layer 10B were flat, the light rays would cause total reflection at the top surface thereof, i.e., even the emitted light rays incident upon the top surface of the light extraction layer 10B at greater angles than the critical angle can also be incident upon the corrugations 10b at smaller angles than the critical angle. As a result, more emitted light rays can be extracted outward, resulting in improved light extraction efficiency.

The light extraction efficiency of the semiconductor light-emitting device of the second embodiment is increased to approximately twice through 2.5 times that of a semiconductor light-emitting device formed with no light extraction layer 10B.

A process for forming a light extraction layer 10B in a fabrication method for a semiconductor light-emitting device according to the second embodiment will be described as follows. First, a silicone resin material containing fine particles of titanium oxide is applied onto the top surface of a semiconductor layered structure 5, and then the applied silicone resin material is cured by heat. Thereafter, the top surface of the cured silicone resin material is exposed to a mixed solution of $H_2SO_4$, $H_2O_2$ and $H_2O$ for approximately 30 seconds. The time during which the cured silicone resin material is exposed to a mixed solution needs to be changed according to the compositions of the mixed solution and temperatures. This process using the mixed solution makes the top surface of the silicone resin material rough, resulting in formation of corrugations 10b. This process using the mixed solution is preferably carried out immediately before wafer dicing.

EMBODIMENT 3

Figure 6A:
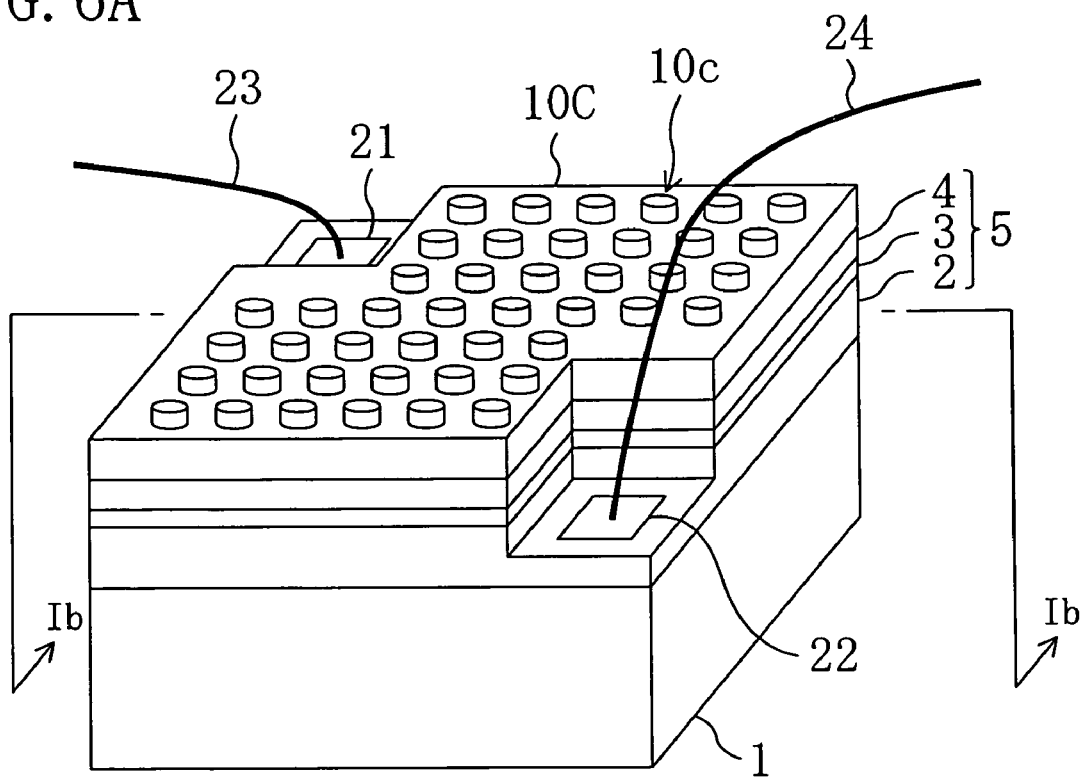
Figure 6B:
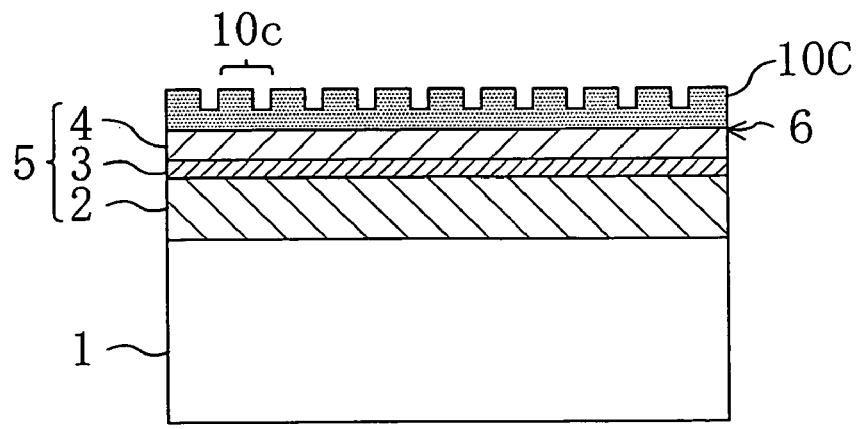

A semiconductor light-emitting device according to a third embodiment of the present invention will be described hereinafter with reference to FIGS. 6A and 6B. In FIGS. 6A and 6B, the same components as illustrated in FIGS. 1A and 1B are denoted by the same reference numerals, and description thereof will be omitted.

As illustrated in FIGS. 6A and 6B, the semiconductor light-emitting device of the third embodiment is configured such that a light extraction layer 10C of a silicone resin material containing fine particles of titanium dioxide at a volume proportion of 70% is formed at its top surface with corrugations 10c of a two-dimensional periodic structure. In this embodiment, the period of the corrugations 10c, i.e., the spacing between the respective centers of adjacent ridges of the corrugations 10c in a two-dimensional plane, is 0.4 μm and the height of each of the ridges is 0.15 μm.

Since a light extraction layer 10C is formed at its top surface with corrugations 10c of a two-dimensional periodic structure as previously mentioned, this provides a vector effect of diffracted light for transmitted light. Therefore, the emitted light rays incident upon the top surface of the light extraction layer 10C at greater angles than the critical angle can also be incident upon the corrugations 10c at smaller angles than the critical angle. This can further improve the light extraction efficiency.

In the third embodiment, the pattern of the corrugations 10c can be controlled more precisely than in the second embodiment in which corrugations 10b are formed by exposing a light extraction layer to a solution. This allows diodes to have the same optical characteristics.

The light extraction efficiency of the semiconductor light-emitting device of the third embodiment is increased to approximately three times that of a semiconductor light-emitting device formed with no light extraction layer 10C.

Figure 7:
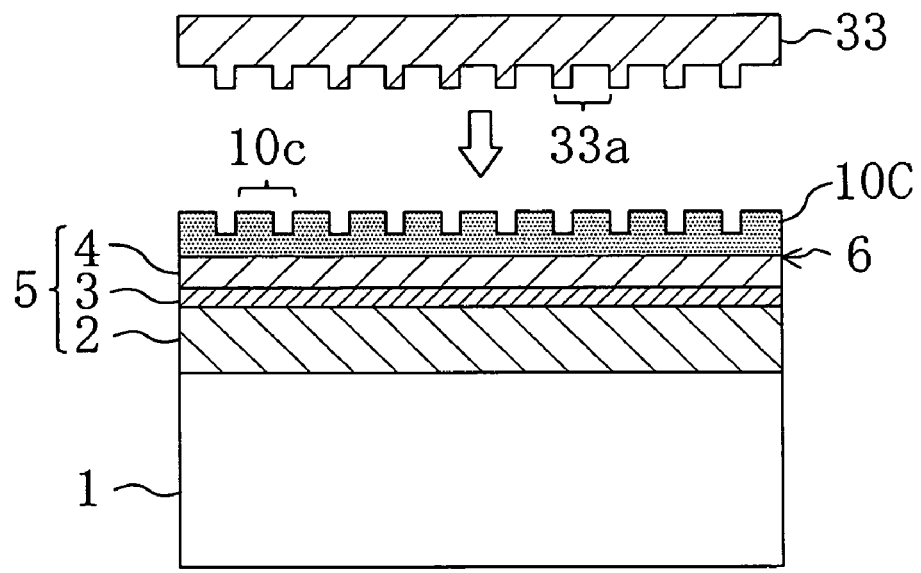
FIG. 7 is a cross-sectional view illustrating a method for forming a light extraction layer according to the third embodiment of the present invention.

A process for forming a light extraction layer 10C in a fabrication method for a semiconductor light-emitting device according to the third embodiment will be described hereinafter with reference to FIG. 7.

First, a silicone resin material containing fine particles of titanium dioxide is applied onto the top surface of the semiconductor layered structure 5. Thereafter, before curing of the applied resin material, a die 33 formed at its pressing surface with the pattern 33a of corrugations and made of silicon carbide (SiC) are pressed against the top surface of the resin material. In this manner, corrugations 10c are formed at the top surface of the uncured silicone resin material with the pattern 33a of corrugations reversed by transferring the pattern 33a of corrugations thereto. Thereafter, the silicone resin material to which the pattern 33a of corrugations has been transferred to obtain the corrugations 10c is cured by heat, thereby forming a light extraction layer 10C.

A method in which corrugations 10c are formed by the presswork as described above leads to high productivity and low cost as seen from the fact that this method is used in the field of production of optical disks, such as compact disks.

EMBODIMENT 4

Figure 8:
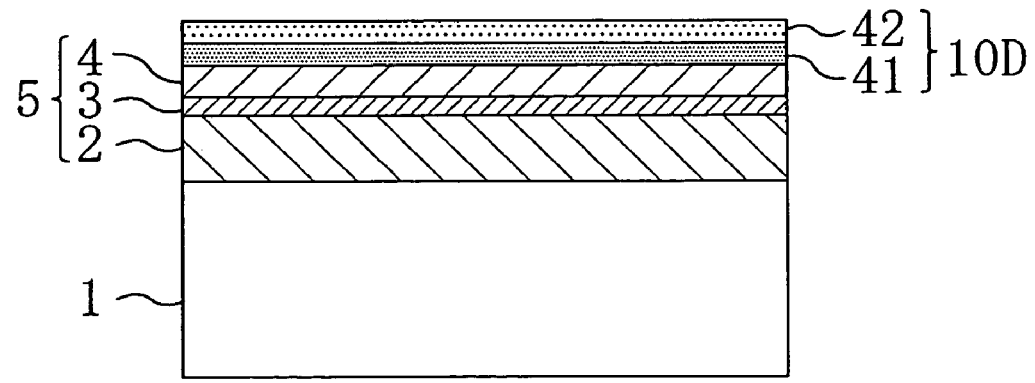
FIG. 8 is a cross-sectional view illustrating a semiconductor light-emitting device according to a fourth embodiment of the present invention.

A semiconductor light-emitting device according to a fourth embodiment of the present invention will be described with reference to FIG. 8. In FIG. 8, the same components as illustrated in FIG. 1B are denoted by the same reference numerals, and description thereof will be omitted.

As illustrated in FIG. 8, a light extraction layer 10D provided for the semiconductor light-emitting device of the fourth embodiment is composed of a first resin layer 41 made of a silicone resin material containing fine particles of titanium dioxide and a second resin layer 42 added with a smaller amount of fine particles than the first resin layer 41. The first resin layer 41 and the second resin layer 42 are sequentially formed on a semiconductor layered structure 5.

The first resin layer 41 has a thickness of 0.07 µm and a titanium dioxide content of 70%, and therefore its effective refractive index is 2.16. On the other hand, the second resin layer 42 has a thickness of 0.07 µm and a titanium dioxide content of 30%, and therefore its effective refractive index is 1.84.

In the fourth embodiment, the light extraction layer 10D takes on a layered structure in which its refractive index is gradually decreased in the direction of light emission. This allows the refractive index of a part of the resin in the vicinity of the interface between the second resin layer 42 and air to become closer to the refractive index of air.

For example, for a known light extraction layer using a resin material that is not added with titanium dioxide, the critical angle relative to the normal to the interface between a second semiconductor layer 4 and the light extraction layer is 42°, and the critical angle for light rays traveling from the light extraction layer into air is 28°. In view of the above, the efficiency with which emitted light rays are extracted from an active layer 3 is insufficient.

On the other hand, for the fourth embodiment in which a light extraction layer 10D is formed to have two different refractive indices, the critical angle relative to the normal to the interface between a second semiconductor layer 4 and a first resin layer 41 is 64°, the critical angle relative to the normal to the interface between the first resin layer 41 and a second resin layer 42 is 58°, and the critical angle relative to the normal to the interface between the second resin layer 42 and air is 37°. This allows more of emitted light rays to be extracted from the active layer 3.

The light extraction efficiency of the semiconductor light-emitting device of the fourth embodiment is increased to approximately 1.5 times that of a semiconductor light-emitting device formed with no light extraction layer 10D.

In a process for forming a light extraction layer 10D in a fabrication method for a semiconductor light-emitting device of the fourth embodiment, a first resin layer 41 and a second resin layer 42 needs to be sequentially formed on a semiconductor layered structure 5 to have the above-mentioned configuration. The second resin layer 42 is formed after curing of the first resin layer 41.

The light extraction layer 10D does not always need to be formed of two layers and may be formed of three or more layers gradually decreased in refractive index in the direction of light emission.

VARIANT OF EMBODIMENT 4

Figure 9:
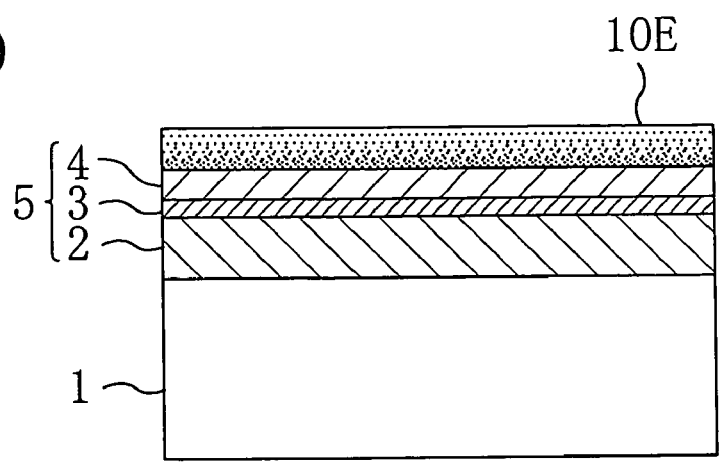
FIG. 9 is a cross-sectional view illustrating a semiconductor light-emitting device according to a variant of the fourth embodiment of the present invention.

In a variant of a fourth embodiment, as illustrated in FIG. 9, a light extraction layer 10E may be configured so that its refractive index is allowed to vary along the direction of light emission by successively decreasing the distribution (density) of fine particles in a single resin layer in the direction of light emission.

In this variant, the light extraction layer 10E has a thickness of 0.2 µm, the volume proportion of titanium dioxide in a part of the light extraction layer 10E located near a semiconductor layered structure 5 is 70%, and the volume proportion of titanium dioxide in a part thereof located far from the semiconductor layered structure 5 is 30%. The distribution of titanium dioxide successively varies.

In order to provide such a distribution, for example, a silicone resin material containing titanium dioxide at a volume proportion of 40% is applied onto the semiconductor layered structure 5, and then the silicone-resin-material-applied semiconductor layered structure 5 is left in a dark place at a temperature of approximately 20° C. for approximately an hour. The silicone resin material is not cured at such a temperature. When as described above the silicone-resin-material-applied semiconductor layered structure 5 is left while being uncured, part of the applied titanium dioxide precipitates to the lower part of the resin material by gravitation. This permits the above-mentioned distribution of titanium dioxide in the resin material.

EMBODIMENT 5

A fifth embodiment of the present invention will be described hereinafter with reference to the drawings.

Figure 10A:
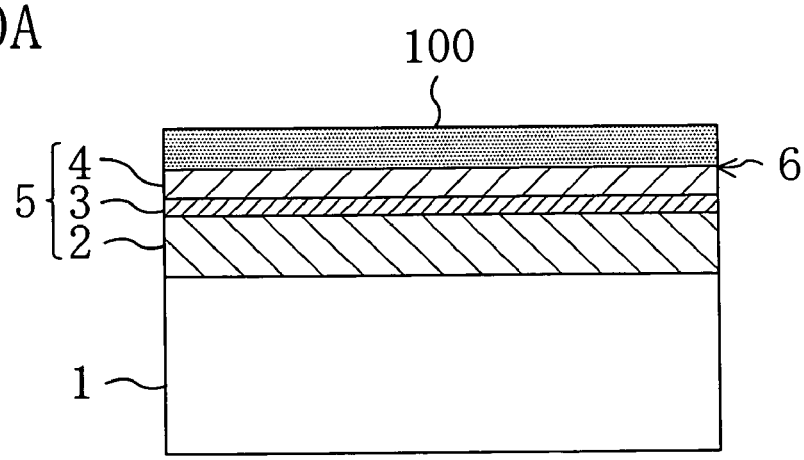
Figure 10B:
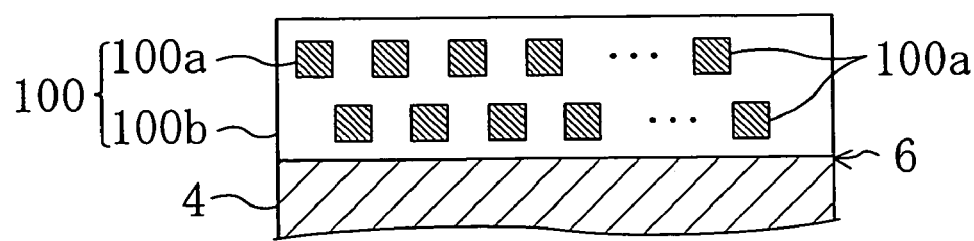

FIGS. 10A and 10B illustrate a semiconductor light-emitting device according to the fifth embodiment of the present invention. FIG. 10A is a cross-sectional view of the semiconductor light-emitting device, and FIG. 10B is an enlarged view illustrating a light extraction layer of the semiconductor light-emitting device illustrated in FIG. 10A and its vicinity. A perspective view of the semiconductor light-emitting device of this embodiment is identical with that in the first embodiment.

The semiconductor light-emitting device of the fifth embodiment represents a light-emitting diode like the semiconductor light-emitting device of the first embodiment. A substrate 1 and a semiconductor layered structure 5 are configured in the same manner as those of the semiconductor light-emitting device of the first embodiment.

The In composition of the InGaN forming an active layer 3 is adjusted so that the active layer 3 produces blue light with a wavelength of approximately 460 nm.

As illustrated in FIG. 10A, a light extraction layer 100 is formed on a semiconductor layered structure 5. As illustrated in FIG. 10B, the light extraction layer 100 has a thickness of 330 nm and includes an $Al_2O_3$ layer 100b having a refractive index of 1.77 and fine particles 100a that take the form of a 90 cm cube, are transparent to blue light and are made of titanium dioxide ($TiO_2$) having a refractive index of 2.4. The $Al_2O_3$ layer 100b is added with the fine particles 100a. One side of each fine particle 100a has a size of 90 nm which is sufficiently smaller than the wavelength of blue light in the $Al_2O_3$ layer 100b, i.e., 260 nm. This prevents emitted light rays from being scattered.

In the fifth embodiment, the $Al_2O_3$ layer 100b contains titanium dioxide at a volume proportion of approximately 27%. Thus, the light extraction layer 100 containing titanium dioxide has an effective refractive index of approximately 1.94. In view of the above, the critical angle relative to the normal to a light extraction interface 6 representing the interface between the second semiconductor layer 4 having a refractive index of 2.4 and the light extraction layer 100 is approximately 54° when determined in accordance with the previously-mentioned formula (2).

In view of the above, according to the fifth embodiment, the critical angle relative to the normal to the interface between the second semiconductor layer 4 and the light extraction layer 100 can be made larger. Therefore, the light extraction efficiency is improved.

A fabrication method for a semiconductor light-emitting device having the above-mentioned structure will be described hereinafter with reference to the drawings.

FIGS. 11A through 11D are cross-sectional views illustrating process steps in a fabrication method for a semiconductor light-emitting device according to a fifth embodiment of the present invention step by step. In these figures, only one diode is illustrated. Actually, a 5.1-cm(2-inch)-diameter wafer is used as a substrate for epitaxial growth. In this case, approximately 2,000 diodes are simultaneously processed at a single wafer.

Figure 11A:
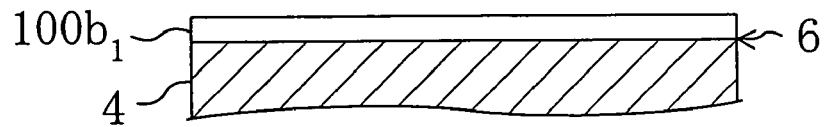
FIGS. 11A through 11D are cross-sectional views illustrating process steps in a fabrication method for a semiconductor light-emitting device according to the fifth embodiment of the present invention.

First, like the first embodiment, a semiconductor layered structure 5 is obtained by MOVPE. In FIGS. 11A through 11D, only the upper part of a second semiconductor layer 4 of the semiconductor layered structure 5 is illustrated. Thereafter, as illustrated in FIG. 11A, a 50-nm-thick first $Al_2O_3$ layer $100b_1$ is formed on the second semiconductor layer 4 by sputtering.

Figure 11B:
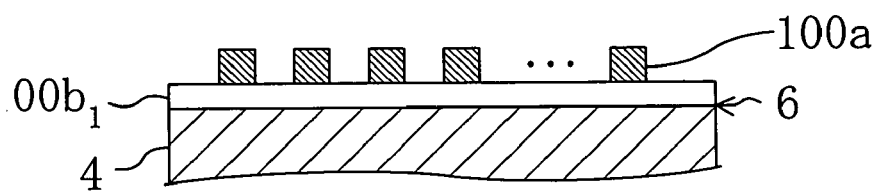

Next, as illustrated in FIG. 11B, a 90-nm-thick titanium dioxide layer is stacked on the first $Al_2O_3$ layer $100b_1$. The stacked titanium dioxide layer is patterned and etched. In this manner, a plurality of fine particles 100a are formed on the first $Al_2O_3$ layer $100b_1$ to take the two-dimensional form of a 90 nm square.

Figure 11C:
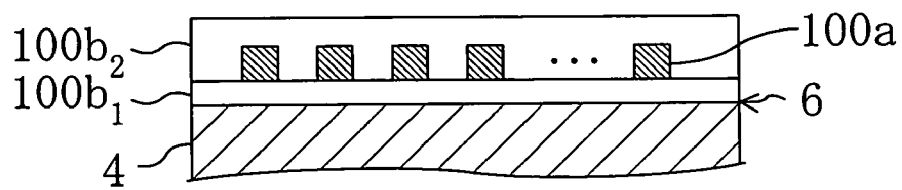

Next, as illustrated in FIG. 11C, a second $Al_2O_3$ layer $100b_2$ is formed by sputtering to fill spaces between the fine particles 100a located on the first the first $Al_2O_3$ layer $100b_1$ and cover the first $Al_2O_3$ layer 100b, and the fine particles 100a.

Figure 11D:
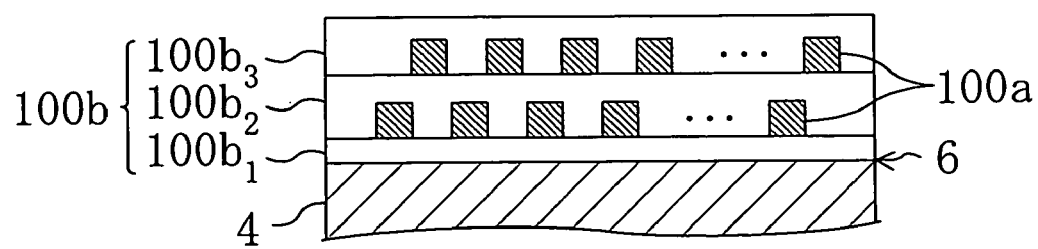

Next, as illustrated in FIG. 11D, a 90-nm-thick titanium dioxide layer is stacked on the second $Al_2O_3$ layer $100b_2$. The stacked titanium dioxide layer is patterned and etched. In this manner, other fine particles 100a are formed on the second $Al_2O_3$ layer $100b_2$ to take the two-dimensional form of a 90 nm square. Subsequently, a third $Al_2O_3$ layer $100b_3$ is formed by sputtering to fill spaces between ones of the fine particles located on the second $Al_2O_3$ layer $100b_2$ and cover the second $Al_2O_3$ layer $100b_2$ and the ones of the fine particles 100a located on the second $Al_2O_3$ layer $100b_2$. In the fifth embodiment, the $Al_2O_3$ layer 100b is composed of the first, second and third $Al_2O_3$ layer $100b_1$, $100b_2$ and $100b_3$.

Thereafter, the semiconductor light-emitting device illustrated in FIG. 10A is obtained through the same process steps as those in the first embodiment.

In the fifth embodiment, each fine particle 100a is cubic. However, as long as the fine particle 100a is sufficiently smaller than the wavelength of blue light in the $Al_2O_3$ layer 100b, i.e., 260 nm, it may have any shape. For example, it may be a three-dimensional object whose surfaces each take the form of a rectangle, a circle, an ellipse, a triangle, or a polygon, such as a pentagon or a hexagon. Alternatively, the three-dimensional object may take the form of, for example, a pyramid, a frustum, a cylinder, or a hemisphere.

Although in the fifth embodiment titanium dioxide ($TiO_2$) is used as a material of fine particles 100a, this is not restrictive. Hafnium oxide, cerium oxide, niobium oxide, tantalum oxide, gallium oxide, aluminum oxide, or zinc oxide can be used as the material of the fine particles 100a.

In the fifth embodiment, fine particles 100a contained in a light extraction layer 100 are formed in both a second $Al_2O_3$ layer $100b_2$ and a third $Al_2O_3$ layer $100b_3$, thereby allowing the fine particles 100a to take on a double-layer structure. As long as emitted light penetrates through the light extraction layer 100 in the same manner as when the light extraction layer 100 is uniform, fine particles 100a may take on a single-layer structure or a multi-layer structure of three or more layers.

Like the variant of the fourth embodiment, the densities at which fine particles 100a are formed in $Al_2O_3$ layers may be successively decreased in the direction of light emission.

A $SiO_2$ layer or a MgO layer can be used instead of an $Al_2O_3$ layer 100b.

EMBODIMENT 6

A sixth embodiment of the present invention will be described hereinafter with reference to the drawings.

Figure 12:
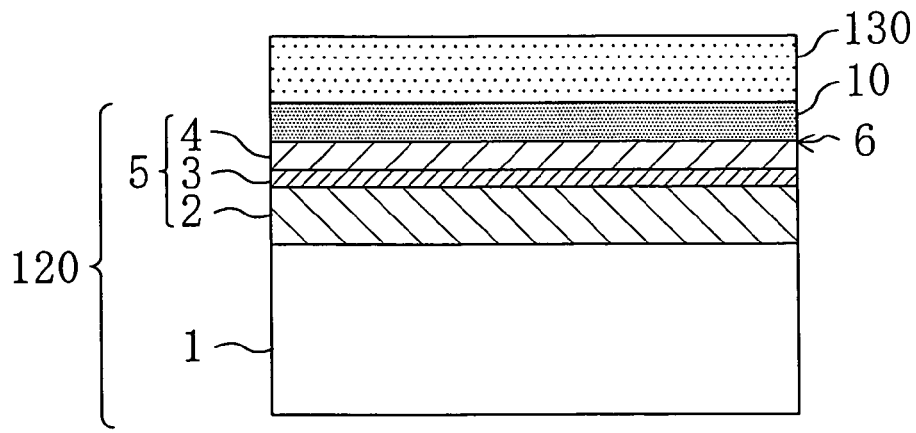
FIG. 12 is a cross-sectional view illustrating a semiconductor light-emitting device according to a sixth embodiment of the present invention.

FIG. 12 illustrates a cross-sectional structure of a semiconductor light-emitting device according to the sixth embodiment of the present invention. A perspective view of the semiconductor light-emitting device according to the sixth embodiment is identical with that of the first embodiment illustrated in FIG. 1A.

The semiconductor light-emitting device of the sixth embodiment is configured so that a resin material 130 containing a YAG (yttrium aluminum garnet) phosphor is applied onto a light extraction layer 10 of a semiconductor light-emitting device 120 described in the first embodiment.

With this structure, white light is produced by a combination of blue light emitted from the semiconductor light-emitting device 120 and emitted light produced in the manner in which the blue light excites the YAG phosphor. Since the semiconductor light-emitting device 120 achieves high light extraction efficiency, this allows white light-emitting diodes to achieve higher light extraction efficiency than known white light-emitting diodes.

VARIANT 1 OF EMBODIMENT 6

Figure 13:
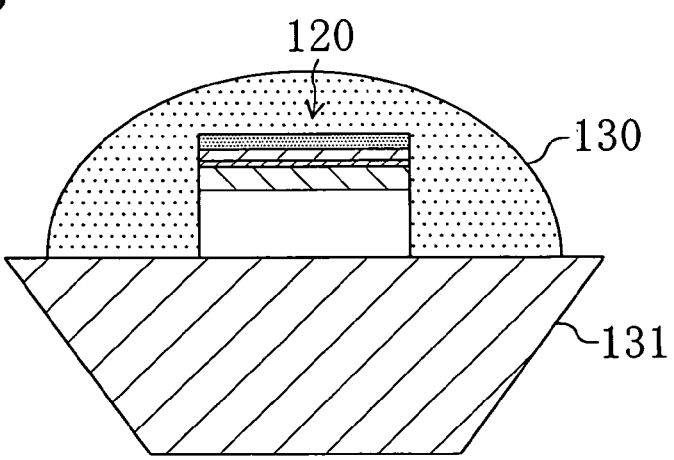
FIG. 13 is a cross-sectional view illustrating a semiconductor light-emitting device according to a first variant of the sixth embodiment of the present invention.

FIG. 13 illustrates a cross-sectional structure of a semiconductor light-emitting device according to a first variant of the sixth embodiment of the present invention.

The semiconductor light-emitting device of the first variant is configured so that a semiconductor light-emitting device 120 of the first embodiment adhered onto a mount 131 is covered with a resin material 130 containing a YAG phosphor.

With this structure, light is produced in the manner in which blue light emitted from the semiconductor light-emitting device 120 excites the YAG phosphor, thereby providing white light. Since the semiconductor light-emitting device 120 achieves high light extraction efficiency, this allows white light-emitting diodes to achieve higher light extraction efficiency than known white light-emitting diodes.

VARIANT 2 OF EMBODIMENT 6

Figure 14:
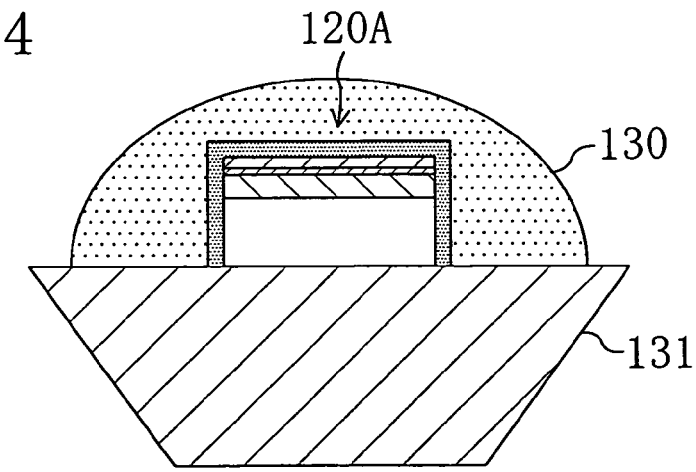
FIG. 14 is a cross-sectional view illustrating a semiconductor light-emitting device according to a second variant of the sixth embodiment of the present invention.
Figure 15:
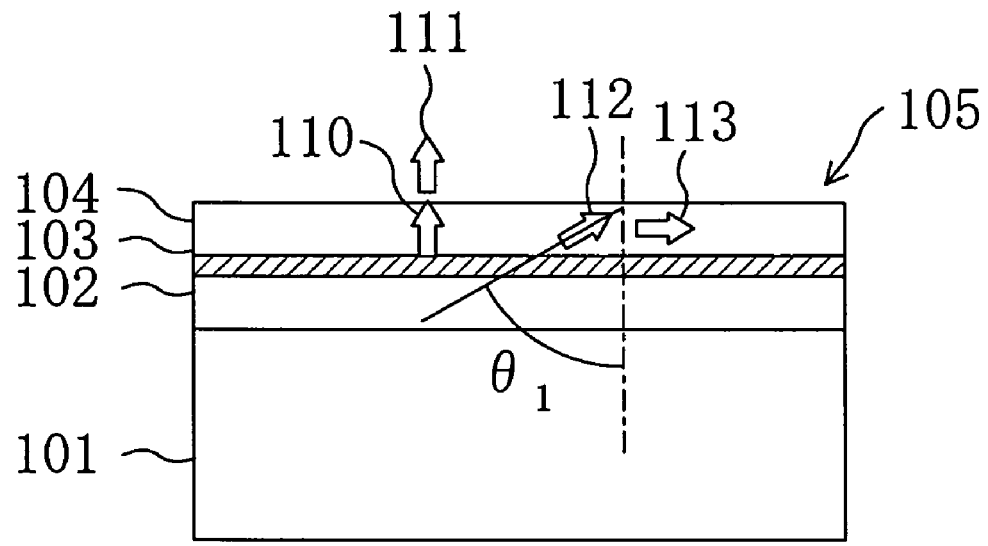
FIG. 15 is a cross-sectional view illustrating a light-emitting diode according to a first known example and directions of light emission.
Figure 16:
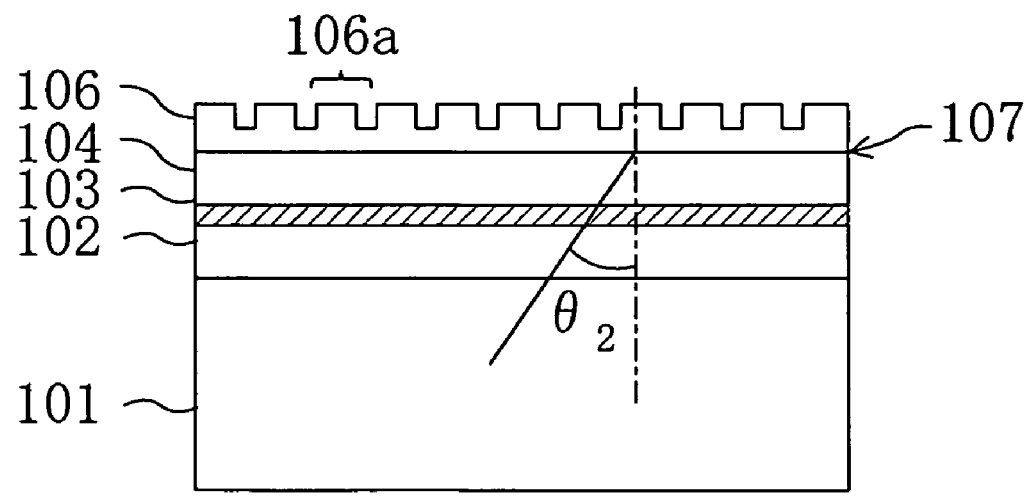
FIG. 16 is a cross-sectional view illustrating a light-emitting diode according to a second known example.

FIG. 14 illustrates a cross-sectional structure of a semiconductor light-emitting device according to a second variant of the sixth embodiment of the present invention.

The semiconductor light-emitting device of the second variant is configured so that a semiconductor light-emitting device 120A of the variant of the first embodiment is covered with a resin material 130 containing a YAG phosphor.

With this structure, light is produced in the manner in which blue light emitted from the semiconductor light-emitting device 120A excites the YAG phosphor, thereby providing white light. Since in the second variant emitted blue light can be efficiently extracted not only from the top surface of the semiconductor light-emitting device 120A but also from the side surfaces of the semiconductor light-emitting device 120A, this can provide white light-emitting diodes with further improved light extraction efficiency.

In the first through sixth embodiments, a material of fine particles with which a resin material is added is not limited to titanium dioxide. Any material that is transparent to emitted light and has a larger refractive index than a resin material and further a smaller particle size than the wavelength of the emitted light can be applied to the present invention.

For example, Nb—$TiO_2$ obtained by adding niobium (Nb) to titanium dioxide ($TiO_2$) has a sufficiently high refractive index of 2.7. When a resin material is added with fine particles of the above-mentioned Nb—$TiO_2$, this further improves the light extraction efficiency.

The following materials can be used as a material of fine particles with which a resin material is added: hafnium dioxide ($HfO_2$) with a refractive index of 1.95; cerium dioxide ($CeO_2$) with a refractive index of 2.2; diniobium pentaoxide ($Nb_2O_5$) with a refractive index of 2.33; ditantalum pentaoxide ($Ta_2O_5$) with a refractive index of 2.16, gallium nitride (GaN) with a refractive index of 2.4, aluminum nitride (AlN) with a refractive index of 2.1 through 2.2, or zinc oxide (ZnO) with a refractive index of 2.1.

In the embodiments, a Group III-V nitride compound semiconductor, i.e., a GaN-based semiconductor, is used for a semiconductor layered structure 5. Even when an AlGaAs-based semiconductor, an InGaAlP-based semiconductor, or an InGaAsP-based semiconductor is used instead of the GaN-based semiconductor, the same effect as in the embodiments can be achieved.

In the first through sixth embodiments, a light extraction layer 10 is composed of a layer made of a material (a resin material or $Al_2O_3$) having a small refractive index and particles ($TiO_2$) having a larger refractive index than the material having a small refractive index, and the light extraction layer 10 has a refractive index between the refractive index of air and that of a semiconductor layered structure. However, this is not restrictive. For example, on the other hand, a light extraction layer may be composed of a layer made of a material having a larger refractive index (e.g., $TiO_2$) and particles having a smaller refractive index than the material having a large refractive index (e.g., $SiO_2$).

In the first through fourth and sixth embodiments, a silicone resin material is used as a material of a resin layer. However, this is not restrictive. For example, an acrylic resin material can be used instead of the silicone resin material.

As described above, a semiconductor light-emitting device according to the present invention and a fabrication method for the same can improve light extraction efficiency with simplicity and reliability and is useful for light-emitting diodes and semiconductor laser diodes serving as light sources for displays, lighting equipment or the like.

What is claimed is:

1. A semiconductor light-emitting device comprising:
   a light-emitting layer; and
   a light extraction layer formed on the light-emitting layer and containing particles,
   the maximum size of each said particle being smaller than the wavelength of emitted light penetrating through the light extraction layer,
   wherein the light extraction layer is added with the particles such that the density of the particles is gradually decreased in a direction of emission of the emitted light.

2. The semiconductor light-emitting device of claim 1, wherein the light extraction layer includes a first layer and a second layer sequentially formed on the light-emitting layer, and
   the amount of ones of the particles with which the second layer is added is smaller than that of ones of the particles with which the first layer is added.

3. A semiconductor light-emitting device comprising:
   a semiconductor layered structure obtained by stacking a plurality of semiconductor layers including a light-emitting layer; and
   a light extraction layer made of a resin material formed on the top surface of at least one part of the semiconductor layered structure,
   said resin material containing particles,
   the refractive index of each said particle for emitted light being larger than that of the resin material for the emitted light, and
   the size of each said particle being smaller than the wavelength of the emitted light penetrating through the resin material,
   wherein the light extraction layer is added with the particles such that the density of the particles is gradually decreased in a direction of emission of the emitted light.

4. The semiconductor light-emitting device of claim 3, wherein
the light extraction layer includes a first layer and a second layer sequentially formed on the semiconductor layered structure, and
the amount of ones of the particles with which the second layer is added is smaller than that of ones of the particles with which the first layer is added.

* * * * *